United States Patent [19]
Kobayashi

[11] Patent Number: 5,733,707
[45] Date of Patent: Mar. 31, 1998

[54] NEGATIVE-WORKING IMAGE RECORDING MATERIAL

[75] Inventor: Fumikazu Kobayashi, Shizuoka, Japan

[73] Assignee: Fuji Photo Film Co., Ltd.

[21] Appl. No.: 685,032

[22] Filed: Jul. 22, 1996

[30] Foreign Application Priority Data

Jul. 31, 1995 [JP] Japan .................................. 7-214112

[51] Int. Cl.⁶ .................................. G03C 1/73; C08F 2/46
[52] U.S. Cl. ...................... 430/284.1; 430/325; 430/964; 430/906; 522/97
[58] Field of Search .................. 430/325, 284.1, 430/270.1, 906, 326, 964; 522/152, 97

[56] References Cited

U.S. PATENT DOCUMENTS

| | | | |
|---|---|---|---|
| 5,360,835 | 11/1994 | Sato et al. | 522/85 |
| 5,360,836 | 11/1994 | Chevallier et al. | 522/96 |

FOREIGN PATENT DOCUMENTS

| | | |
|---|---|---|
| 62-164049 | 7/1987 | Japan . |
| 4001762 | 1/1992 | Japan . |
| 6-1088 | 1/1994 | Japan . |
| 7028242 | 1/1995 | Japan . |

*Primary Examiner*—Janet C. Baxter
*Assistant Examiner*—Rosemary Ashton
*Attorney, Agent, or Firm*—Burns, Doane, Swecker & Mathis, LLP

[57] ABSTRACT

The present invention provides a negative-working image recording material which can be used as a lithographic printing plate for so-called direct plate making process comprising directly making plate from digital signal such as computer signal. A novel negative-working image recording material is provided, comprising a high-molecular compound having a weight-average molecular weight of from 5,000 to 400,000 and a repeating unit represented by the following general formula (I), and a substance which absorbs light to generate heat:

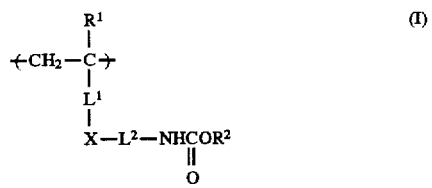

wherein $R^1$ represents a hydrogen atom, a halogen atom, a cyano group (—CN) or an alkyl group; $R^2$ represents an alkyl group, an aralkyl group or an aromatic ring group; $L^1$ represents a single bond or a phenylene group; $L^2$ represents an alkylene group, an alkenylene group or an aromatic ring group; X represents a single bond, —O—, —OCO—, —COO—, —CONR³—, —CONR³CO—, —CONR³SO₂—, —NR³—, —NR³CO—, —NR³SO₂—, —SO₃—, —SO₂NR³— or —SO₂NR³CO—; and $R^3$ represents a hydrogen atom, an alkyl group, an aralkyl group or an aromatic ring group. The negative-working image recording material according to the present invention can provide a lithographic printing plate which can be exposed to infrared laser to undergo heat mode writing and exhibits a high sensitivity and developability when developed with an aqueous developer.

8 Claims, No Drawings

NEGATIVE-WORKING IMAGE RECORDING MATERIAL

FIELD OF THE INVENTION

The present invention relates to a negative-working image recording material which can be used as an offset printing master. More particularly, the present invention relates to a negative-working image recording material which can be used as a lithographic printing plate for a so-called direct plate making process comprising directly making a plate from a digital signal such as a computer signal.

BACKGROUND OF THE INVENTION

As systems for directly making a plate from digital data from a computer there have been heretofore proposed (1) an electrophotographic process, (2) a photopolymerization process which comprises exposure to Ar laser and post-processing in combination, (3) a process employing a laminate of a photosensitive resin and a silver salt photographic material, (4) a process employing a silver master, (5) a process which comprises destruction of a silicone rubber layer by discharge or laser, etc.

In the foregoing electrophotographic process (1), the processing required for charging, exposure and development is complicated, and the apparatus required is complicated and elaborate. Further, the foregoing photopolymerization process (2) requires a post-heating step. This process also requires a high sensitivity plate-making material which is difficult to handle in daylight (a bright room). Furthermore, the foregoing processes (3) and (4) each employ a silver salt that requires complicated processing that adds to cost. Further, the foregoing process (5) can attain a relatively high perfection but leaves something to be desired in the removal of silicone residual left on the surface of the printing plate.

On the other hand, laser technology has made remarkable progress in recent years. In particular, solid lasers and semiconductor lasers which emit light in the range of near infrared to infrared are now easily available with a high output and a small size. These lasers are very useful as exposure light sources for use in direct plate making from digital data from computer, etc. However, most practically useful photosensitive image recording materials absorb light in the wavelength range of not higher than 450 nm and thus cannot be exposed to these lasers for image recording. Thus, an image recording material which can perform recording independent of the wavelength of the exposure light would be useful.

As a technique enabling recording independent of the wavelength of the exposure light there is disclosed a positive-working image recording material comprising a compound which decomposes when acted on by light or heat (e.g., diazonium compound), a particulate substance which can absorb light and convert it to heat and a binder in JP-A-52-113219 (The term "JP-A" as used herein means an "unexamined published Japanese patent application"). When heated, this positive-working image recording material undergoes decomposition of a diazonium compound to record an image.

JP-A-62-164049 and JP-A-6-1088 disclose a photographic light-sensitive material comprising a blocked isocyanate and a light-to-heat conversion substance in combination. However, such a photographic light-sensitive material exhibits an insufficient sensitivity and press life due to the use of a low molecular blocked isocyanate. U.S. Pat. No. 5,360,836 discloses a monomer compound having a blocked isocyanate structure and a polymerizable double bond. However, there have been neither negative-working image recording materials comprising a blocked isocyanate compound which can perform high sensitivity thermal recording with a solid laser or semiconductor laser (heat mode) which emits light in the range of infrared to near infrared to provide an image having a high preservability nor negative-working image recording materials which can be satisfactorily developed with the same aqueous alkaline developer as used for the conventional lithographic printing plates.

SUMMARY OF THE INVENTION

It is therefore an object of the present invention to provide a negative-working image recording material which can perform recording independent of the wavelength of light from the exposure light source.

It is another object of the present invention to provide a negative-working image recording material which can perform recording in the wavelength range of near infrared to infrared (heat ray).

It is a further object of the present invention to provide a negative-working image recording material having a high sensitivity and preservability, a prolonged press life and an excellent developability for heat mode writing type direct plate making which can perform recording with a solid laser or semiconductor laser (heat mode) which emits light in the range of near infrared to infrared to make plate directly from digital data from computer, etc., which plate can be processed by any conventional processing apparatus (particularly developing apparatus) or printing apparatus.

These and other objects of the present invention will become more apparent from the following detailed description and examples.

The foregoing objects of the present invention are accomplished by the following constitution (1). Preferred constitutions (2) to (5) will be also given below.

(1) A negative-working image recording material, comprising a high-molecular compound having a weight-average molecular weight of from 5,000 to 400,000 and a repeating unit represented by the following general formula (I), and a substance which absorbs light to generate heat:

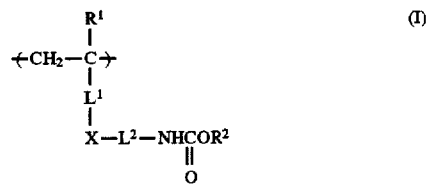

wherein $R^1$ represents a hydrogen atom, a halogen atom, a cyano group (—CN) or an alkyl group; $R^2$ represents an alkyl group, an aralkyl group or an aromatic ring group; $L^1$ represents a single bond or a phenylene group; $L^2$ represents an alkylene group, an alkenylene group or an aromatic ring group; X represents a single bond, —O—, —OCO—, —COO—, —CONR$^3$—, —CONR$^3$CO—, —CONR$^3$SO$_2$—, —NR$^3$—, —NR$^3$CO—, —NR$^3$SO$_2$—, —SO$_3$—, —SO$_2$NR$^3$— or —SO$_2$NR$^3$CO—; and $R^3$ represents a hydrogen atom, an alkyl group, an aralkyl group or an aromatic ring group.

(2) The negative-working image recording material as defined in Constitution (1), wherein said high-molecular compound is a water-insoluble and aqueous alkali-soluble or swelling resin.

(3) The negative-working image recording material as defined in Constitution (1) or (2), wherein X in the general formula (I) is —COO— or —CONR$^3$SO$_2$— and $L^1$ is a single bond.

(4) The negative-working image recording material as defined in Constitution (3), wherein X in the general formula (I) is —CONHSO$_2$—.

(5) The negative-working image recording material as defined in any one of Constitutions (1) to (4), wherein said high-molecular compound is synthesized from a monomer represented by the following general formula (II):

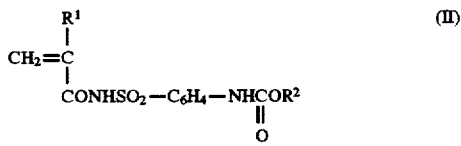

wherein R$^1$ represents a hydrogen atom, a halogen atom, a cyano group (—CN) or an alkyl group; and R$^2$ represents an alkyl group, an aralkyl group or an aromatic ring group.

DETAILED DESCRIPTION OF THE DRAWINGS

The present invention will be further described hereinafter.

The negative-working image recording material according to the present invention comprises a high-molecular compound having a repeating unit represented by the foregoing general formula (I). The negative-working image recording material according to the present invention converts an exposure energy to a heat energy by which the high-molecular compound undergoes crosslinking reaction to effect image recording.

Preferred embodiments of the negative-working image recording material according to the present invention will be described hereinafter.

In the present invention, the substance which absorbs light to generate heat is advantageously a substance which absorbs infrared rays or near infrared rays to generate heat to effect better heat mode recording.

In the present invention, the substance which absorbs infrared rays or near infrared rays to generate heat is advantageously a dye from the standpoint of developability after exposure. Further, the substance which absorbs infrared rays or near infrared rays to generate heat is advantageously a pigment to provide a higher sensitivity. Still further, the substance which absorbs infrared rays or near infrared rays to generate heat is advantageously carbon black among pigments to provide a wider absorption wavelength range and a higher sensitivity.

The negative-working image recording material according to the present invention is preferably subjected to a negative-working image recording process which comprises exposure to light from a laser which emits infrared rays or near infrared rays, followed by development with an aqueous alkali.

The negative-working image recording material according to the present invention is preferably used as a negative-working heat-sensitive lithographic printing plate. Alternatively, the negative-working image recording material according to the present invention is preferably used as a heat mode writing type negative-working lithographic printing plate for direct plate making.

In the heat mode writing process, a proper heat radiation source is used. The heat radiation source is controlled according to digital data to perform recording on an image recording material. As such a heat radiation source there may be used a thermal head for use in facsimile or a laser which emits infrared rays or near infrared rays. However, such a thermal head disadvantageously has a low image resolution. Accordingly, the laser which emits infrared rays or near infrared rays is desirable for direct plate making.

The negative-working image recording material according to the present invention comprises a high-molecular compound which undergoes crosslinking reaction by heat converted from light by a light-to-heat conversion substance. Thus, the negative-working image recording material according to the present invention can be essentially regarded as photosensitive. Preferred examples of radiation employable herein include ultraviolet rays, visible rays, and infrared rays. Among these radiations, infrared rays are generally also called heat rays. Accordingly, if infrared rays are used to effect recording, the negative-working image recording material according to the present invention can be also regarded as heat-sensitive.

In the present invention, as the support there can be advantageously used a polyester film to give a lighter weight. Further, an aluminum plate can be advantageously used to give a better dimensional stability.

The present invention will be further described hereinafter.

The negative-working image recording material according to the present invention comprises an image recording material layer such as photosensitive layer provided on a support, characterized in that the photosensitive layer comprises a high-molecular compound having a repeating unit represented by the foregoing general formula (I) incorporated therein.

Referring to the general formula (I), R$^1$ represents a hydrogen atom, a halogen atom (e.g., F, Cl, Br, I), a cyano group (—CN) or an alkyl group (preferably having from 1 to 6 carbon atoms). The alkyl group represented by R$^1$ may be a straight-chain or branched alkyl group such as methyl group, ethyl group, n-propyl group and i-propyl group. R$^1$ is preferably a hydrogen atom, methyl group or the like.

R$^2$ represents an alkyl group, an aralkyl group or an aromatic ring group. The alkyl group represented by R$^2$ may be a straight-chain or branched alkyl group preferably having from 1 to 10 carbon atoms which may have substituents (e.g., alkoxy such as methoxy). Examples of such an alkyl group include ethyl group, n-propyl group, i-propyl group, n-butyl group, i-butyl group, sec-butyl group, t-butyl group, pentyl group, hexyl group, heptyl group, n-octyl group, 2-ethylhexyl group, methoxyethyl group, and ethoxyethyl group.

The aralkyl group represented by R$^2$ is preferably a C$_{7-12}$ aralkyl group which may have one or more substituents (including condensed ring). Examples of such an aralkyl group include benzyl group, phenethyl group, methoxybenzyl group, and piperonyl group.

The aromatic ring group represented by R$^2$ may have one or more substituents. A particularly preferred example of the aromatic ring group is an aryl group preferably having from 6 to 10 carbon atoms, such as phenyl group, methoxyphenyl group and naphthyl group.

Preferred examples of R$^2$ include methyl group, ethyl group, methoxyethyl group, i-butyl group, 2-ethylhexyl group, benzyl group, and phenyl group.

L$^1$ represents a single bond or phenylene group, preferably single a bond.

L$^2$ represents an alkylene group, alkenylene group or aromatic ring diyl group.

The alkylene group represented by L$^2$ may have one or more substituents. The alkylene group may have —O— interposed therein. The alkylene group may be straight-chain or branched. The alkylene group preferably has from 1 to 10 carbon atoms. If the alkylene group has —O— interposed therein, the number of carbon atoms in the units repeated through the oxygen atom is preferably from 2 to 4. Specific examples of such an alkylene group include —$CH_2CH_2$—, —$CH_2CH_2$—O—$CH_2CH_2$—, —$CH_2CH_2CH_2$—, —$CH_2CH(CH_3)$—, and —$CH_2C(CH_3)_2CH_2$—.

The alkenylene group represented by $L^2$ may have one or more substituents. The alkenylene group preferably has from 2 to 8 carbon atoms. The alkenylene group may be straight-chain or branched. Specific examples of such an alkenylene group include vinylene group, propenylene group, and 2-butenylene group (—$CH_2CH=CHCH_2$—).

The aromatic ring group represented by $L^2$ may have one or more substituents. A particularly preferred example of the aromatic ring group is an arenediyl group. The arenediyl group preferably has from 6 to 14 carbon atoms. Examples of such an arenediyl group include phenylene group, and naphthylene group.

X represents a single bond, —O—, —OCO—, —COO—, —$CONR^3$—, —$CONR^3CO$—, —$CONR^3SO_2$—, —$NR^3$—, —$NR^3CO$—, —$NR^3SO_2$—, —$SO_3$—, —$SO_2NR^3$— or —$SO_2NR^3CO$— in which $R^3$ represents a hydrogen atom or a substituted or unsubstituted alkyl, aralkyl or aromatic ring group.

The alkyl group represented by $R^3$ preferably has from 1 to 8 carbon atoms. Examples of such an alkyl group include methyl group, ethyl group, i-propyl group, and t-butyl group. Specific examples of the aralkyl group and aromatic ring group represented by $R^3$ include those exemplified with reference to $R^2$.

Preferred examples of X include —O—, —COO—, —$CONHSO_2$—, —CO—N($CH_3$)$SO_2$—, —CO—NHCO—, and —$SO_2NH_2$—. Among these groups, —COO—, —$CONHSO_2$—, —CON($CH_3$)$SO_2$—, etc. are further preferred. Particularly preferred among these groups is —$CONHSO_2$—. Such a group is preferably combined with a single bond represented by $L_1$.

Examples of the repeating unit represented by the general formula (I) which can be preferably used in the present invention include those having the following structural formulae, but the present invention is not limited thereto.

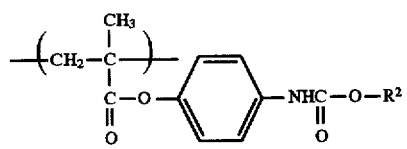

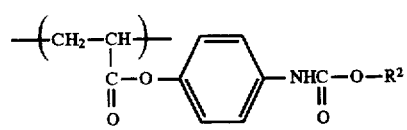

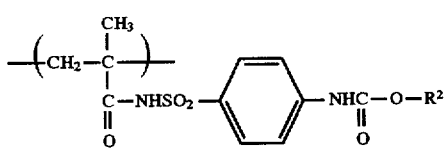

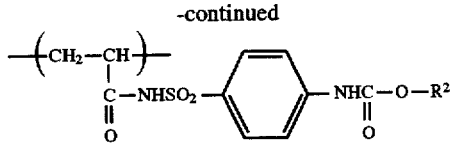

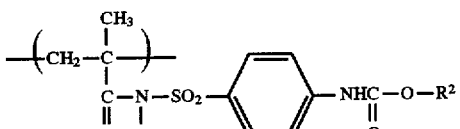

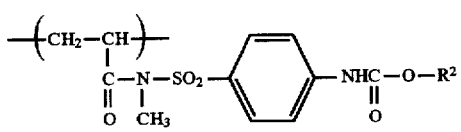

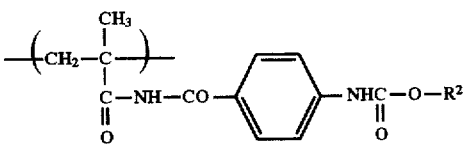

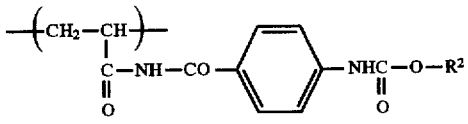

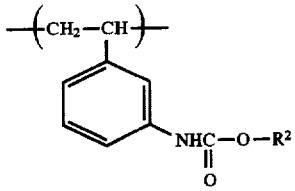

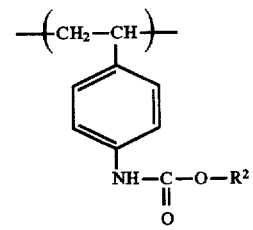

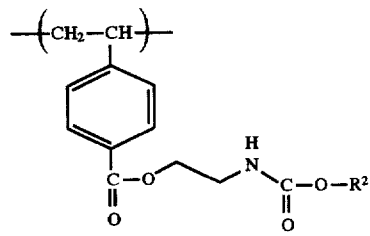

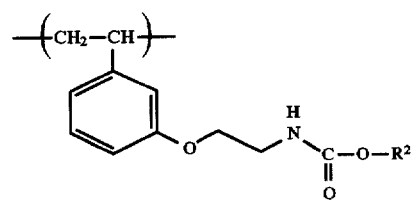

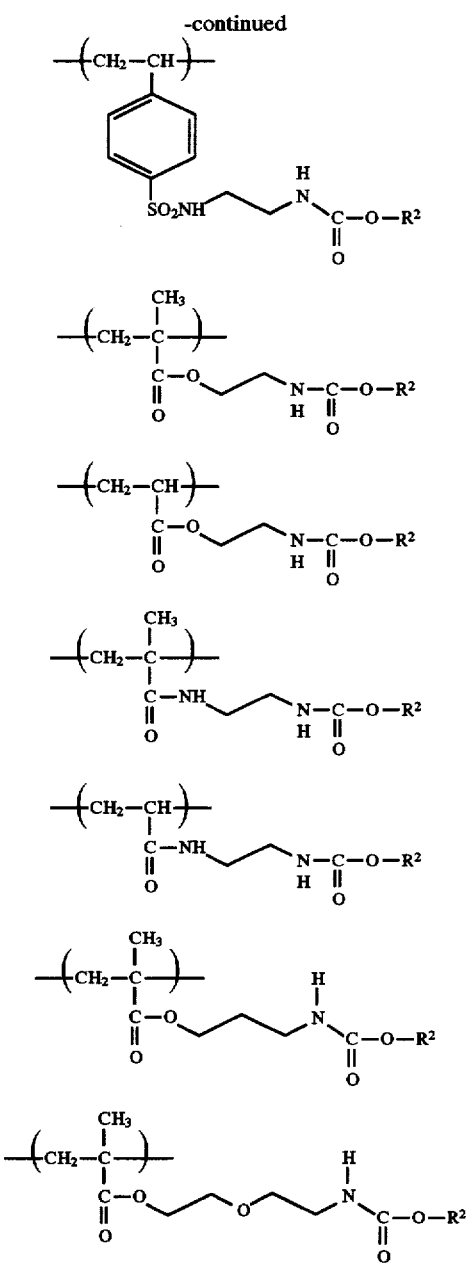

In the foregoing structural formulae, $R^2$ represents a substituted or unsubstituted alkyl, aralkyl or aromatic ring group. Specific examples of these groups include those exemplified above.

The foregoing high-molecular compound can be incorporated in an image recording material which converts an exposure energy to a heat energy by which the high-molecular compound undergoes crosslinking reaction to perform image recording. That is, the high-molecular compound can be incorporated in a negative-working image recording material which is subjected to a negative-working image recording process comprising exposure and subsequent development with an aqueous developer or aqueous alkaline developer.

Accordingly, the high-molecular compound having a repeating unit represented by the general formula (I) preferably has an alkali-soluble group or other hydrophilic groups in the structure represented by the general formula (I) or the structure of the copolymerizable component to enhance the developability of the negative-working image recording material in an aqueous alkaline developer. In other words, the high-molecular compound is preferably a water-insoluble and aqueous alkali-soluble or swellable resin.

Examples of the repeating unit represented by the general formula (I) comprising an alkali-soluble group or other hydrophilic groups incorporated therein include those wherein X is —CONH—, —CONHCO—, —CONHSO$_2$—, —NHCO—, —NHSO$_2$—, —SO$_2$NH— or —SO$_2$NHCO—.

If a monomer containing an alkali-soluble group or other hydrophilic monomers are used as copolymerizable components, the alkali-soluble group may be an acidic group having pKa of not more than 14, such as —SO$_3$H, —OP(O)(OH)$_2$, —P(O)(OH)$_2$, —COOH, —CONHCO—, —CONHSO$_2$—, —SO$_2$NH— and phenolic OH group. Specific examples of the monomer containing an alkali-soluble group include acrylic acid, methacrylic acid, itaconic acid, and the following compounds:

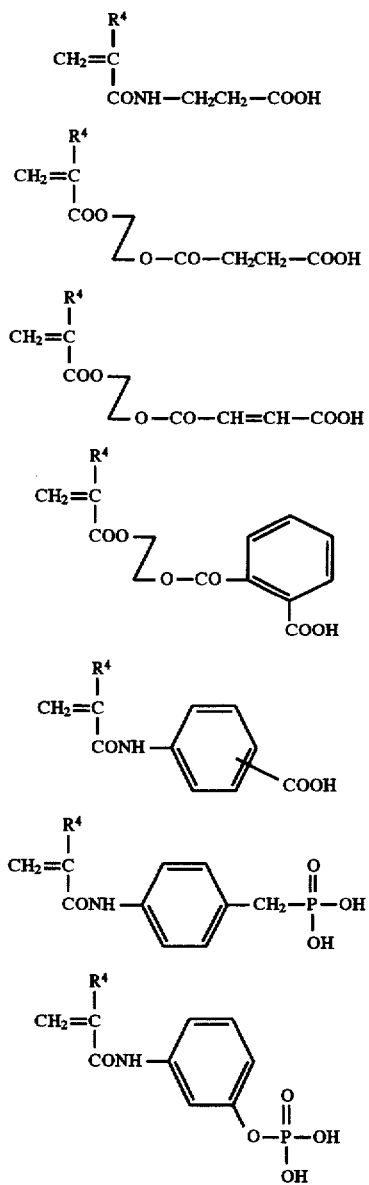

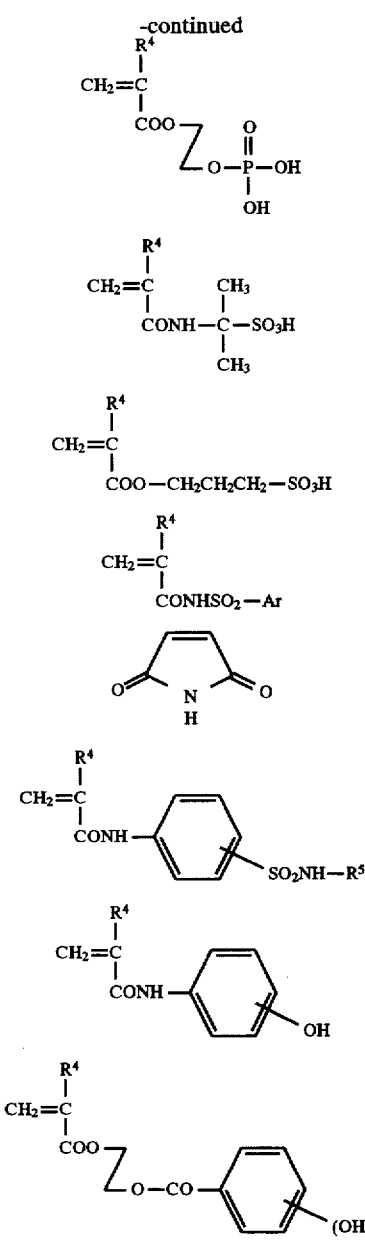

In the foregoing general formulae, $R^4$ represents a hydrogen atom or a methyl group. $R^5$ represents a hydrogen atom or an alkyl, aralkyl or aromatic ring group having not more than 12 carbon atoms which may have one or more substituents (e.g., halogen, methoxy, hydroxyl, cyano). Ar represents an aromatic ring group having not more than 12 carbon atoms which may have one or more substituents (e.g., halogen, methoxy, hydroxyl, cyano, alkyl having not more than 5 carbon atoms). The suffix n represents an integer of from 1 to 3.

Specific examples of the foregoing other hydrophilic monomers include 2-hydroxyethyl (meth)acrylate, 2-hydroxypropyl (meth)acrylate, 3-hydroxypropyl (meth) acrylate, 2,3-dihydroxypropyl (meth)acrylate, 2-methoxyethyl (meth)acrylate, 2-ethoxyethyl (meth) acrylate, acrylonitrile, methacrylonitrile, (meth)acrylamide, N-methyl (meth)acrylamide, and the following compound:

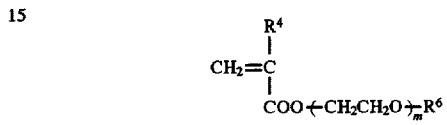

wherein $R^4$ represents a hydrogen atom or a methyl group; $R^6$ represents a hydrogen atom or an alkyl, aralkyl, aromatic ring or acyl group having not more than 12 carbon atoms; and m represents an integer of from 2 to 20. (Most hydrophilic monomers which are commercially available are in the form of mixture. In such a mixture, m often represents an average value such as 5.7.)

Among the foregoing hydrophilic monomers, those having a hydroxyl group as a hydrophilic group are preferred from the standpoint of curability upon exposure.

The high-molecular compound to be used in the present invention preferably comprises a repeating unit represented by the general formula (I) in an amount of not less than 5 mol-%. If the high-molecular compound comprises a repeating unit represented by the general formula (I) alone, it may be a homopolymer made of the same repeating unit or a copolymer made of different repeating units. If the high-molecular compound comprises repeating units derived from other monomers, it is a copolymer. Such a copolymer may be any of alternating copolymer, random copolymer, block copolymer, etc.

Such a high-molecular compound may comprise various end groups incorporated therein depending on the purpose. For example, ester group, cyano group and carboxyl group derived from polymerization initiators may be introduced into the high-molecular compound.

Specific examples of the high-molecular compound having a repeating unit represented by the general formula (I) which can be preferably used herein include those having the following structural formulae, but the present invention is not limited thereto.

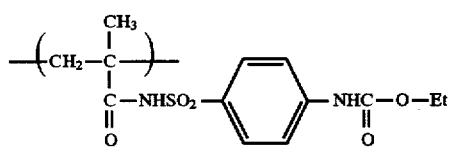

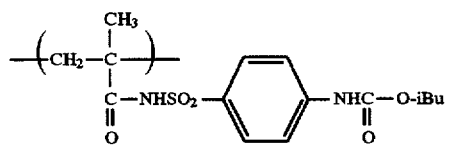

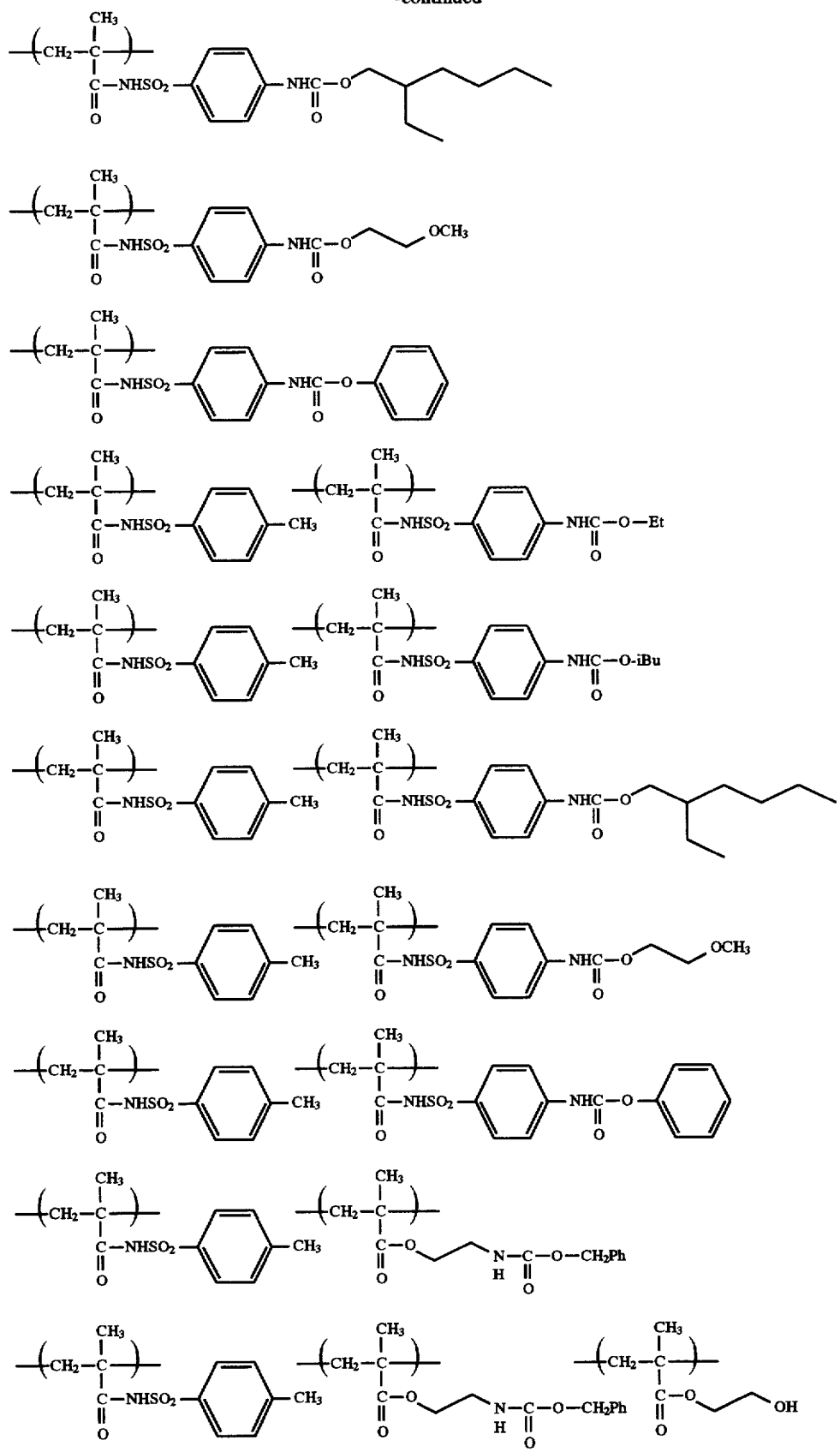

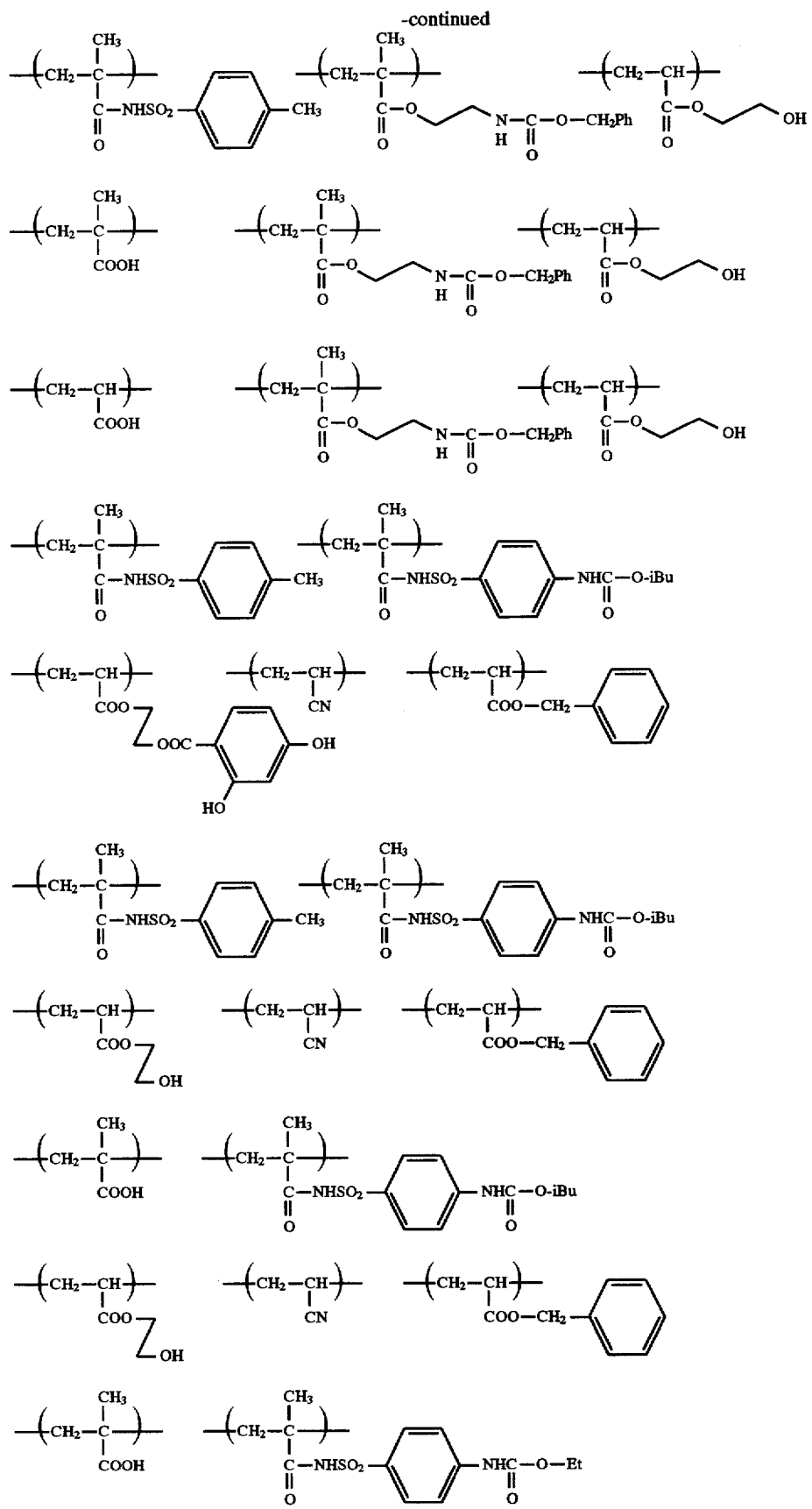

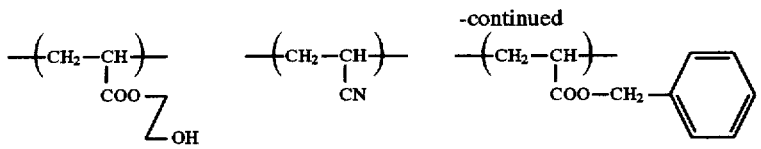

The high-molecular compound having a repeating unit represented by the general formula (I) preferably has a weight-average molecular weight of from 5,000 to 400,000 and a number-average molecular weight of from 2,000 to 150,000. If the high-molecular compound has too low a molecular weight, it lacks curability during exposure. On the contrary, if the high-molecular compound has too high a molecular weight, the resulting negative-working image recording material is apt to develop drops or stains during printing.

An example of the compound useful for the synthesis of the high-molecular compound having a repeating unit represented by the general formula (I) is a monomer represented by the general formula (II).

In the general formula (II), $R^1$ and $R^2$ are as defined in the general formula (I). Specific examples of such a compound include those having the following structural formulae, but the present invention is not limited thereto.

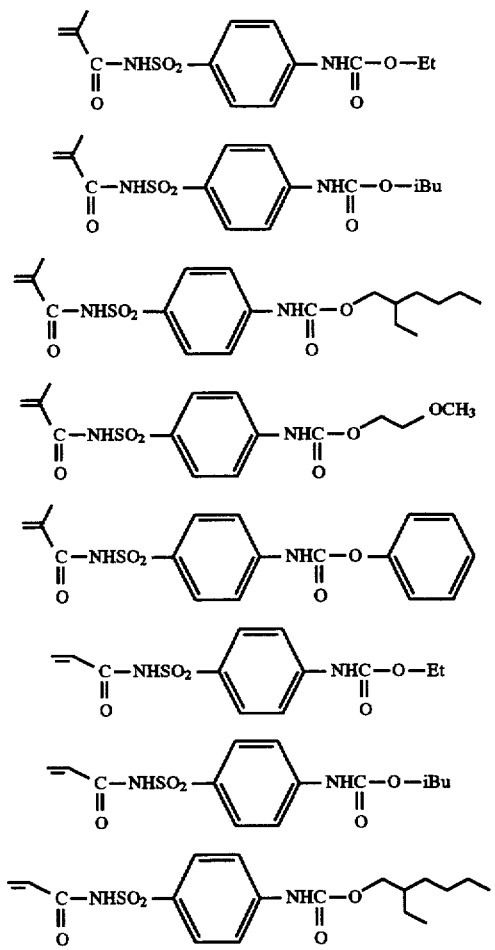

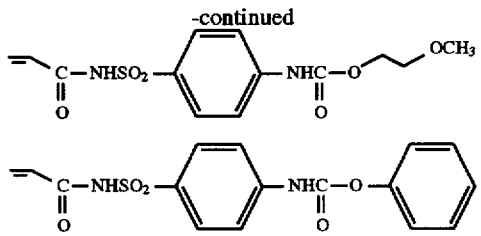

Such a high-molecular compound having a repeating unit represented by the general formula (I) may be used singly or in combination with one or more different kinds of such high-molecular compounds. Such a high-molecular compound may be used in an amount of not less than 5% by weight, preferably from 5 to 99% by weight, more preferably from 20 to 95% by weight, based on the total solid content of the photosensitive composition constituting the photosensitive layer. If the content of the high-molecular compound having a repeating unit represented by the general formula (I) falls below 5% by weight, no desirable images can be obtained.

In the present invention, as the substance which absorbs light to generate heat there may be used any pigment or dye.

As these pigments there may be used commercial pigments and pigments described in Handbook of Color Index (C.I.), "Handbook of Modern Pigments", Japan Pigment Technology Association (1977), "Applied Technology of Modern Pigments", CMC Shuppan (1986), and "Technology of Printing Ink", CMC Shuppan (1984).

Examples of these pigments include black pigment, yellow pigment, orange pigment, brown pigment, red pigment, purple pigment, blue pigment, green pigment, fluorescent pigment, and polymer-bound dye. Specific examples of the pigments employable herein include insoluble azo pigment, azo lake pigment, condensed azo pigment, chelate azo pigment, phthalocyanine pigment, anthraquinone pigment, perylene pigment, perinone pigment, thioindigo pigment, quinacridone pigment, dioxazine pigment, isoindolinone pigment, quinophthalone pigment, dyed lake pigment, azine pigment, nitroso pigment, nitro pigment, natural pigment, fluorescent pigment, inorganic pigment, and carbon black.

Such a pigment may be optionally subjected to surface treatment before use. Examples of possible surface treatment methods include a method which comprises coating the surface of the pigment with a resin or wax, a method which comprises attaching a surface active agent to the pigment, and a method which comprises bonding a reactive substance (e.g., silane coupling agent, epoxy compound, polyisocyanate) to the surface of the pigment. These surface treatment methods are further described in "Properties and Application of Metallic Soap", Sachi Shobo (1988), "Technology of Printing Ink", CMC Shuppan (1984), and "Applied Technology of Modern Pigments", CMC Shuppan (1986).

The grain diameter of the pigment is preferably from 0.01 to 10 μm, more preferably from 0.05 μm to 1 μm. As the method for dispersing the pigment there may be used any known dispersion method used in the production of ink or toner. Examples of dispersing apparatus which can be employed in these dispersing methods include ultrasonic dispersing machine, sand mill, attritor, pearl mill, supermill, ball mill, impeller, disperser, KD mill, colloid mill, dynatron, three-roll mill, and pressure kneader. These dispersing apparatus are further described in "Applied Technology of Modern Pigments", CMC Shuppan (1986).

As the dye there may be used any of commercial dyes and known dyes described in references (e.g., "Handbook of Dyes", The Society of Synthetic Organic Chemistry, Japan (1970)). Specific examples of dyes employable herein include azo dye, metal complex azo dye, pyrazolone azo dye, anthraquinone dye, phthalocyanine dye, carbonium dye, quinoneimine dye, methine dye, and cyanine dye.

Particularly preferred among these pigments or dyes are those which absorb infrared rays or near infrared rays.

As the pigment which absorbs infrared rays or near infrared rays there may be preferably used carbon black.

Examples of the dye which absorbs infrared rays or near infrared rays include cyanine dyes described in JP-A-58-125246, JP-A-59-84356, JP-A-59-202829, and JP-A-60-78787, methine dyes described in JP-A-58-173696, JP-A-58-181690, and JP-A-58-194595, naphthoquinone dyes described in JP-A-58-112793, JP-A-58-224793, JP-A-59-48187, JP-A-73996, JP-A-60-52940, and JP-A-60-63744, squarylium dyes described in JP-A-58-112792, and cyan dyes described in British Patent 434,875.

Further, near infrared absorbents described in U.S. Pat. No. 5,156,938 can be preferably used.

Further, substituted arylbenzo(thio)pyrylium salts disclosed in U.S. Pat. No. 3,881,924, trimethinethiapyrylium salts disclosed in JP-A-57-142645 (U.S. Pat. No. 4,327,169), pyrylium compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethinethiopyrylium salts disclosed in U.S. Pat. No. 4,283,475, and pyrylium compounds disclosed in JP-B-5-13514 (The term "JP-B" as used herein means an "examined Japanese patent publication") and JP-B-5-19702 are particularly preferred.

Another preferred example of dye is a near infrared absorbing dye represented by the general formula (I) or (II) as these formulae are disclosed in U.S. Pat. No. 4,756,993.

Such a pigment or dye may be incorporated in the image recording material layer in an amount of from 0.01 to 50% by weight, preferably from 0.1 to 20% by weight, more preferably from 0.5 to 15% by weight, based on the total solid content in the image recording material layer. If the content of the pigment or dye falls below 0.01% by weight, no desirable images can be obtained. On the contrary, if the content of the pigment or dye exceeds 50% by weight, the resulting negative-working image recording material is apt to develop stain on the non-image areas during printing.

Such a dye or pigment may be incorporated in either the same layer with the high-molecular compound having a repeating structural unit represented by the general formula (I) or a separate layer or both of them. If the dye or pigment is incorporated in a separate layer, it is preferably incorporated in layers adjacent to the layer comprising the high-molecular compound having a repeating structural unit represented by the general formula (I).

The negative-working image recording material according to the present invention comprises a substance which absorbs light to generate heat and a high-molecular compound having a repeating unit represented by the general formula (i) incorporated therein as essential components. If the negative-working image recording material according to the present invention is used as a lithographic printing plate, it may further comprise other high-molecular compounds (resins) incorporated therein to enhance the printing properties thereof. As such resins there may be used various known polymers. These resins preferably have an alkali-soluble group or other hydrophilic groups incorporated in their structures to enhance the developability in an aqueous alkaline developer similarly to the high-molecular compound having a repeating structural unit represented by the general formula (I). A polymer having a hydroxyl group as a hydrophilic group is desirable because it can undergo crosslinking reaction with the high-molecular compound having a repeating structural unit represented by the general formula (I) during exposure.

Resins other than the high-molecular compound having a repeating structural unit represented by the general formula (I), if incorporated in the negative-working image recording material according to the present invention, may be used singly or in combination. The amount of such resins to be incorporated is normally not more than 90% by weight, preferably not more than 70% by weight, based on the solid content of the photosensitive composition.

The image recording material layer such as photosensitive layer in the negative-working image recording material according to the present invention may optionally further comprise various additives incorporated therein.

For example, a multifunctional monomer having two or more radically polymerizable ethylenic double bonds per molecule may be incorporated in the image recording material layer. Examples of such a compound include ethylene glycol di(meth)acrylate, diethylene glycol di(meth)acrylate, polyethylene glycol di(meth)acrylate, hexane diol di(meth) acrylate, trimethylol ethane tri(meth)acrylate, trimethylol propane tri(meth)acrylate, and tri(meth)acrylate, tetra(meth) acrylate and hexa(meth)acrylate of pentaerythritol and dipentaerythritol. The amount of such a multifunctional monomer to be incorporated is normally not more than 30% by weight based on the total weight of the image recording material layer.

Further examples of additives which can be incorporated in the image recording material layer include an alkylether for improving coatability (e.g., ethyl cellulose, methyl cellulose), a surface active agent (e.g., fluorine surface active agent), and a plasticizer for providing film softening property and abrasion resistance (e.g., tricresyl phosphate, dimethyl phthalate, dibutyl phthalate, trioctyl phosphate, tributyl phosphate, tributyl citrate, polyethylene glycol, polypropylene glycol). The amount of these additives to be incorporated depends on their purpose but is normally from 0.5 to 30% by weight based on the total solid content in the image recording material layer.

A representative example of printing-out agent for providing a visible image immediately after the heat generation due to exposure is a combination of a compound which releases an acid when heated due to exposure and an organic dye capable of forming a salt. Specific examples of such a printing-out agent employable herein include a combination of halogenide o-naphthoquinonediazide-4-sulfonate and a salt-forming organic dye as disclosed in JP-A-50-36209 and JP-A-53-8128, and a combination of a trihalomethyl compound and a salt-forming organic dye as disclosed in JP-A-53-36223 and JP-A-54-74728. As the image colorant there may be also used any dye other than the foregoing salt-forming organic dye. Preferred examples of dyes, including salt-forming organic dyes, include oil-soluble dyes and basic dyes. Specific examples of these dyes include Oil Yellow #101, Oil Yellow #130, Oil Pink #312, Oil Green BG, Oil Blue BOS, Oil Blue #603, Oil Black BY, Oil Black BS, Oil Black T-505 (available from Orient Chemical Industries, Inc.), Victoria Pure Blue, Crystal Violet (CI42555), Methyl Violet (CI42535), Rhodamine B (CI45170B), Malachite Green (CI42000), and Methylene Blue (CI52015).

The printing-out agent and dye are incorporated in an amount of from 0 to 30% by weight based on the total weight of the image recording material layer.

If the use of the substance which absorbs light to generate heat of the present invention provides a visible image having a sufficient density, such a dye doesn't need to be added.

The image recording material layer according to the present invention such as photosensitive layer may be provided by coating a support with the foregoing components in the form of solution or dispersion in a solvent. Examples of the solvent employable herein include methanol, ethanol, isopropyl alcohol, n-butyl alcohol, t-butyl alcohol, ethylene dichloride, cyclohexanone, acetone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, tetrahydrofuran, dioxane, dimethyl sulfoxide, ethyl acetate, methyl lactate, and ethyl lactate. These solvents may be used singly or in admixture.

A mixed solvent obtained by adding to such a solvent or mixed solvent a small amount of water or a solvent which doesn't dissolve high-molecular compounds therein, such as toluene, is preferred, too.

The concentration of the foregoing components (solid content) in the solvent is from 1 to 50% by weight.

If the solution or dispersion thus obtained is coated and dried, drying is preferably effected at a temperature of from 50° C. to 120° C. The drying process may comprise pre-drying at a low temperature and subsequent drying at a higher temperature. Alternatively, drying may be effected at a high temperature if the solvent and concentration are properly selected.

The applied amount of the coating material depends on the purpose. If the negative-working image recording material is used e.g., as a photosensitive lithographic printing plate (heat-sensitive lithographic printing plate), the applied amount of the coating material is normally from 0.5 to 3.0 g/m$^2$ as calculated in terms of solid content. The less the applied amount of the coating material is, the higher is the sensitivity but the poorer are physical properties. If necessary, a matte or matte layer may be provided on the photosensitive layer.

Examples of the support to be coated with an image recording material layer of the present invention include paper, paper laminated with a plastic (e.g., polyethylene, polypropylene, polystyrene), plate made of a metal such as aluminum (including aluminum alloy), zinc and copper, film made of a plastic such as cellulose diacetate, cellulose triacetate, cellulose propionate, cellulose acetate, cellulose acetobutyrate, cellulose butyrate, polyethylene terephthalate, polyethylene, polystyrene, polypropylene, polycarbonate and polyvinyl acetal, and paper or plastic film laminated or vacuum-metallized with the foregoing metals. Preferred among these support materials is a polyester film or aluminum plate. In particular, the aluminum plate has a remarkable dimensional stability. Thus, the use of such an aluminum plate advantageously provides a good dimensional stability. Further, the polyester film has a light weight which provides an additional advantage. A still further example of the support which can be preferably used is a composite sheet obtained by laminating an aluminum sheet on a polyethylene terephthalate film as disclosed in JP-B-48-18327.

The support having a metallic surface, particularly aluminum surface, is preferably subjected to a proper hydrophilic treatment.

The hydrophilic treatment may be conducted as follows. For example, the surface of an aluminum plate is grained by a mechanical graining method such as wire brush graining, nylon brush graining with a slurry of abrasive grains and ball graining, a chemical graining with HF, AlCl$_3$ or HCl as an etchant, an electrolytic graining with nitric acid or hydrochloric acid as an electrolyte or a composite thereof, optionally etched with an acid or alkali, and then anodically oxidized with DC or AC current in sulfuric acid, phosphoric acid, oxalic acid, boric acid, chromic acid, sulfamic acid or mixture thereof to form a rigid passive film thereon. Such a passive film can render the aluminum surface hydrophilic. If necessary, the aluminum surface thus treated is preferably subjected to treatment with silicate (e.g., sodium silicate, potassium silicate) as disclosed in U.S. Pat. Nos. 2,714,066 and 3,181,461, treatment with potassium fluorozirconate as disclosed in U.S. Pat. No. 2,946,638, treatment with phosphomolybdate as disclosed in U.S. Pat. No. 3,201,247, treatment with alkyl titanate as disclosed in British Patent No. 1,108,559, treatment with polyacrylic acid as disclosed in German Patent No. 1,091,433, treatment with polyvinylphosphonic acid as disclosed in German Patent No. 1,134,093 and British Patent No. 1,230,447, treatment with phosphonic acid as disclosed in JP-B-44-6409, treatment with phytic acid as disclosed in U.S. Pat. No. 3,307,951, composite treatment with a hydrophilic organic high-molecular compound and a divalent metal as disclosed in JP-A-58-16893 and JP-A-58-18291, or undercoating with a water-soluble polymer having a sulfonic group as disclosed in JP-A-59-101651, so that it is further rendered hydrophilic. Other examples of hydrophilic treatment include silicate electrodeposition as disclosed in U.S. Pat. No. 3,658,662.

As the active ray source for use in imagewise exposure there may be used a mercury vapor lamp, metal halide lamp, xenon lamp, chemical lamp, carbon-arc lamp or the like. Examples of radiation include electron rays, X rays, ion beam, and far infrared rays. Further, g-line, i-line, Deep-UV rays, and high density energy beam (laser beam) may be used. Examples of such a laser beam include helium-neon laser, argon laser, krypton laser, helium-cadmium laser, and KrF excimer laser. In the present invention, a light source which emits light in the range of near infrared to infrared is desirable. In particular, a solid laser or semiconductor laser is preferred.

As the developer for the negative-working image recording material according to the present invention or its replenisher there may be used any known aqueous alkaline solution. Examples of such an alkali include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide. Alternatively, organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine may be used.

These alkaline agents may be used singly or in combination.

The developer or its replenisher may optionally comprise various surface active agents or organic solvents incorporated therein for the purpose of accelerating or inhibiting developability and enhancing dispersibility of development residue and ink-receptivity of the image area on the printing plate. Preferred examples of such surface active agents include anionic, cationic, nonionic and amphoteric surface active agents.

Further, the developer or its replenisher may optionally comprise a reducing agent such as hydroquinone, resorcin and sodium and potassium salt of inorganic acid such as sulfurous acid and hydrogensulfurous acid, organic carboxylic acid, defoaming agent, hard water softener, etc. incorporated therein.

Preferred examples of the developer employable herein include those described in JP-A-54-62004 and JP-B-57-7427, a developer composition comprising benzyl alcohol, an anionic surface active agent, an alkaline agent and water as disclosed in JP-A-51-77401, a developer composition comprising an aqueous solution containing benzyl alcohol, an anionic surface active agent and a water-soluble sulfurous acid as disclosed in JP-A-53-44202, and a developer composition comprising an organic solvent having a solubility to water of not more than 10% by weight at normal temperature, an alkaline agent and water as disclosed in JP-A-55-155355.

In the case where the negative-working image recording material according to the present invention is used as a printing plate, the negative-working image recording material which has been subjected to development with the foregoing developer and replenisher is preferably subjected to post-treatment with a rinsing solution containing a washing water and a surface active agent or a desensitizing solution containing gum arabic or a starch derivative. The post-treatment may comprise these treatments in combination.

In the recent plate-making and printing industry, automatic developing machines for printing plate have been widely used from the standpoint of the rationalization and standardization of plate-making process. These automatic developing machines normally consist of a development zone and a post-treatment zone. These automatic developing machines comprise an apparatus for carrying a printing plate, various processing tanks, and a spraying apparatus. In operation, various processing solutions which have been pumped up are sprayed through the respective nozzle onto an exposed printing plate which is being carried horizontally. A system has been recently known in which the printing plate is dipped in a processing solution tank filled with a processing solution while being carried guided by a submerged guide roll. In such an automatic processing process, the various processing solutions may be replenished by its replenisher depending on the throughput, operating time, etc.

Further, a so-called throwaway system which comprises processing with a substantially unused processing solution may be employed.

If the lithographic printing plate obtained by the imagewise exposure, development, and washing and/or rinsing and/or gumming has an unnecessary image area (e.g., mark given by the edge of original film) left thereon, the unnecessary image area needs to be deleted. This deletion can be accomplished by a process which comprises applying a deletion liquid described in JP-B-2-13293 to such an unnecessary image area, allowing the material to stand over a predetermined period of time, and then rinsing the material.

The lithographic printing plate of the present invention which has been developed can be subjected to heat treatment at a temperature of from 150° C. to 250° C. for 1 to 20 minutes in the same manner as burning effected for the conventional positive-working lithographic printing plate to further enhance the strength of the image area.

The lithographic printing plate thus obtained can then be optionally coated with a desensitizing gum before use in the printing process.

The present invention will be further described in the following examples together with synthesis examples and comparative synthesis examples, but the present invention should not be construed as being limited thereto.

Examples of the synthesis of monomers of the present invention will be given below.

SYNTHESIS EXAMPLE 1

77.5 g of methacryloyloxyethyl isocyanate (Karenzu MOI, available from Showa Denko K.K.) and 60 g of benzyl alcohol were dissolved in 260 g of dioxane. To the solution were then added 5 drops of di-n-butyltin dilaurate. The reaction mixture was then allowed to undergo reaction at a temperature of 65° C. for 3 hours. The dioxane and excess benzyl alcohol were then distilled off under reduced pressure. The residue was poured into water, extracted with ethyl acetate, and then dried. The solvent was then distilled off to obtain 106 g of benzyloxycarbonylaminoethyl methacrylate in the form of colorless oil.

SYNTHESIS EXAMPLE 2

To a mixture of 86 g of sulfanylamide, 79 g of pyridine and 200 ml of N,N-dimethylacetamide was added dropwise 75 g of isobutyl chlorocarbonate under cooling with ice. After the completion of the dropwise addition, the reaction mixture was stirred at room temperature overnight. The reaction mixture was then poured into hydrochlorically acidified water. The resulting crystal was then withdrawn by filtration. The crystal was then recrystallized from ethyl acetate to obtain 132 g of p-isobutyloxycarbonylaminophenyl sulfonamide in the form of white crystal.

To a mixture of 54.4 g of p-isobutyloxycarbonylaminophenyl sulfonamide, 40 g of triethylamine, 2 g of N,N-dimethylaminopyridine and 150 ml of N,N-dimethylacetamide was then added dropwise 22.8 g of methacrylic chloride under cooling with ice. After the completion of the dropwise addition, the reaction mixture was stirred for 2 hours. The reaction product was then poured into water. The resulting crystal was then withdrawn by filtration. The crystal was then recrystallized from a 3/7 (by volume) mixture of toluene and ethyl acetate to obtain 40 g of N-(p-isobutyloxycarbonylaminophenylsulfonyl) methacrylamide in the form of white crystal (m.p. 194°–196° C.).

SYNTHESIS EXAMPLE 3

The procedure of Synthesis Example 2 was followed except that ethyl chlorocarbonate was used. As a result, N-(p-ethoxycarbonylaminophenylsulfonyl)methacrylamide was obtained in the form of white crystal (m.p. 197°–200° C.).

SYNTHESIS EXAMPLE 4

The procedure of Synthesis Example 2 was followed except that 2-ethylhexyl chlorocarbonate was used. As a result, N-(p-(2-ethylhexyloxycarbonylamino) phenylsulfonyl) methacrylamide was obtained in the form of white crystal (m.p. 123°–127° C.).

SYNTHESIS EXAMPLE 5

The procedure of Synthesis Example 2 was followed except that methoxyethyl chlorocarbonate was used. As a result, N-(p-(2-methoxyethoxycarbonylamino) phenylsulfonyl) methacrylamide was obtained in the form of white crystal (m.p. 174°–177° C.).

SYNTHESIS EXAMPLE 6

The procedure of Synthesis Example 2 was followed except that phenyl chlorocarbonate was used. As a result, N-(p-phenoxycarbonylaminophenylsulfonyl) methacrylamide was obtained in the form of white crystal (m.p. 190°–193° C.).

The structural formulae of the monomers thus obtained will be given below.

(Synthesis Example 1)

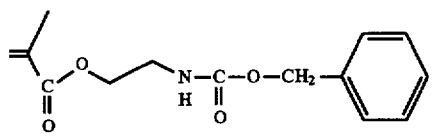

(Synthesis Example 2)

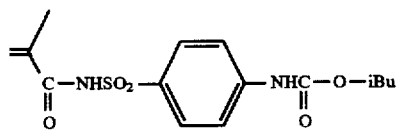

(Synthesis Example 3)

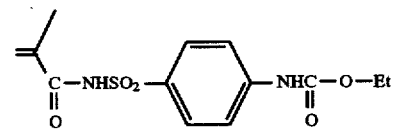

(Synthesis Example 4)

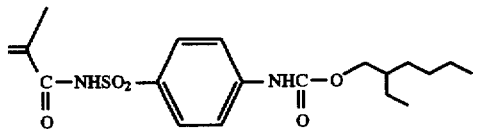

(Synthesis Example 5)

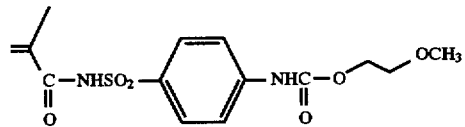

(Synthesis Example 6)

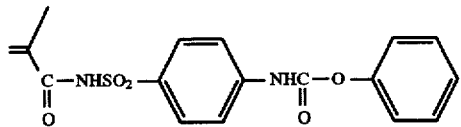

Polymers to be used in the present invention were synthesized from the monomers thus synthesized and other components. Examples of the synthesis of these polymers will be given below.

SYNTHESIS EXAMPLE 7

10.50 g of the monomer of Synthesis Example 1 and 36.12 g of N-(p-toluenesulfonyl)methacrylamide were dissolved in 93 g of dimethylacetamide. The reaction mixture was then heated to a temperature of 65° C. with stirring in a stream of nitrogen. To the reaction mixture was then added 45 mg of 2,2'- azobis(2,4-dimethylvaleronitrile). After 2 hours, 45 mg of 2,2'- azobis(2,4-dimethylvaleronitrile) was added to the reaction mixture. After 2 hours, 99 mg of 2,2'-azobis(2,4-dimethylvaleronitrile) was added to the reaction mixture. The reaction mixture was stirred at a temperature of 65° C. for 2 hours, and then allowed to cool to room temperature. To the reaction solution was then added 50 ml of acetone. The reaction solution was then poured into 2 l of water. The resulting solid matter was withdrawn by filtration, washed with water, and then dried. The resulting solid matter was a high-molecular compound which exhibits a weight-average molecular weight of 45,000 as determined by a light-scattering method.

SYNTHESIS EXAMPLES 8 TO 18

The procedure of Synthesis Example 7 was followed to synthesize the following various high-molecular compounds. The composition ratio shown in the polymer structures are represented by percent molar fraction. The polymer synthesized in Synthesis Example 7 will be shown as well.

(Synthesis Example 7)

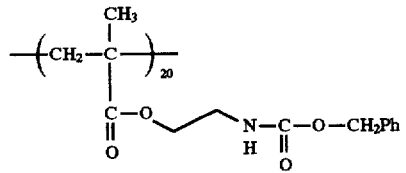

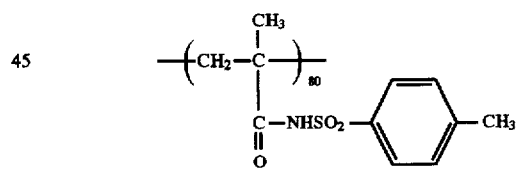

(Synthesis Example 8)

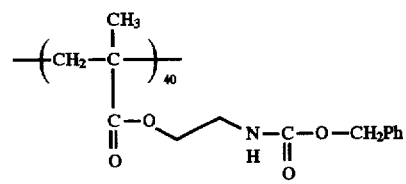

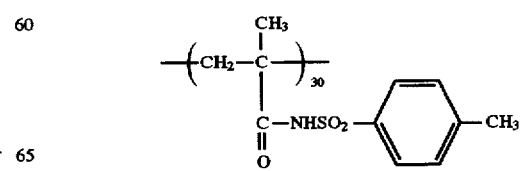

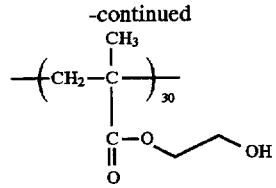
(Synthesis Example 9)
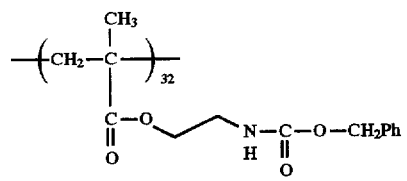
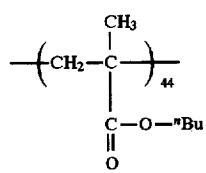
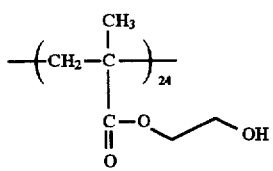
(Synthesis Example 10)
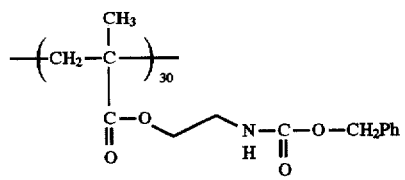
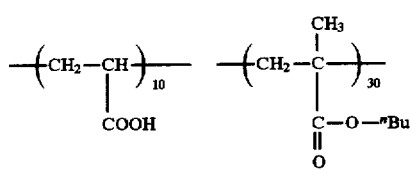
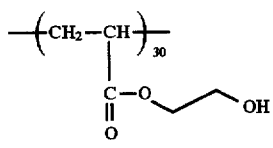
(Synthesis Example 11)
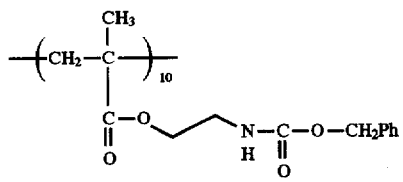
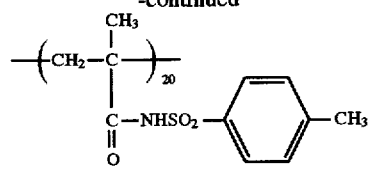
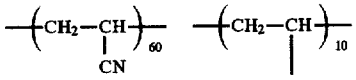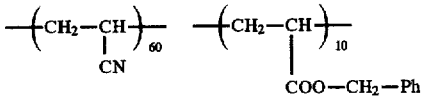
(Synthesis Example 12)
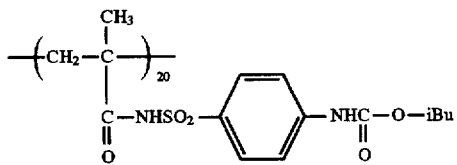
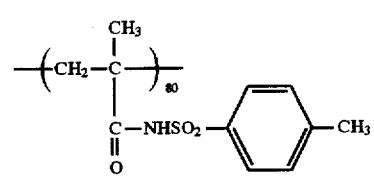
(Synthesis Example 13)
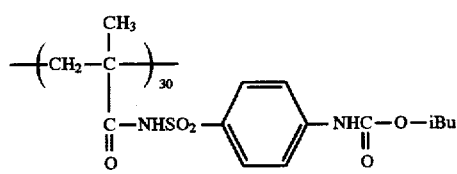
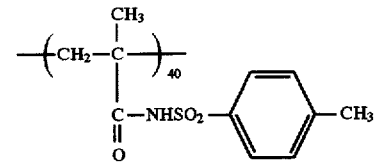
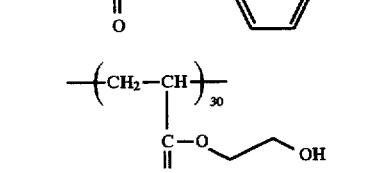
(Synthesis Example 14)
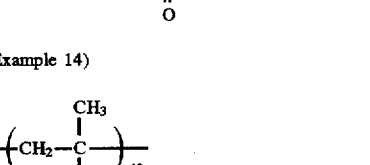
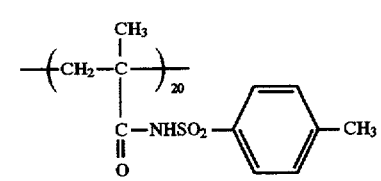

-continued

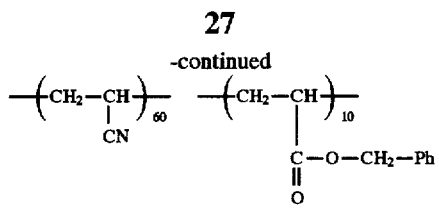

(Synthesis Example 15)

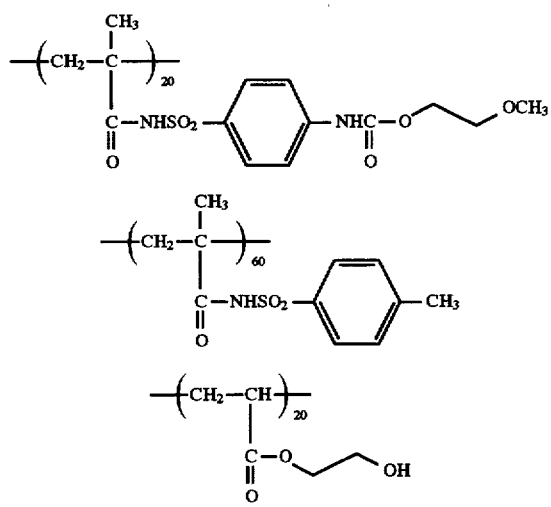

(Synthesis Example 16)

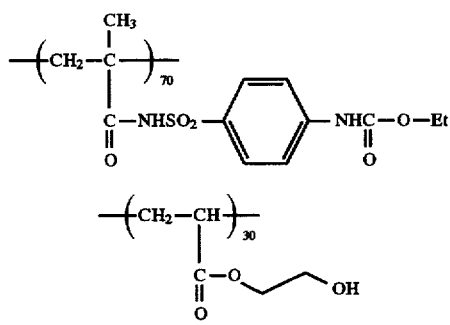

(Synthesis Example 17)

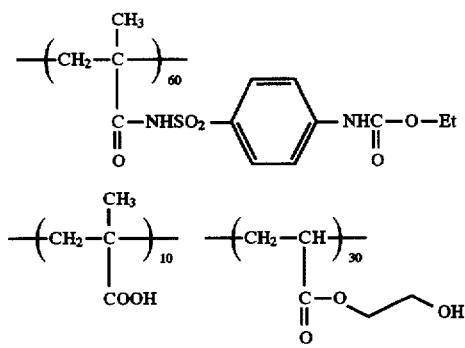

(Synthesis Example 18)

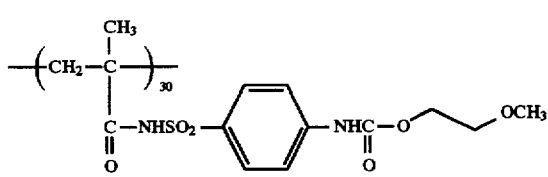

-continued

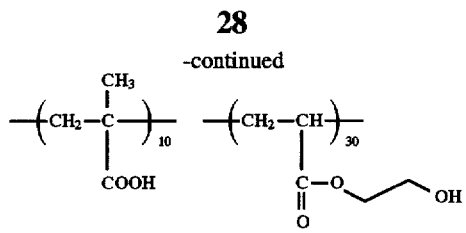

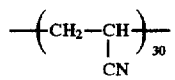

EXAMPLES 1 TO 14 AND COMPARATIVE EXAMPLES 1 TO 4

Negative-working image recording materials to be used as negative-working lithographic printing plates were prepared.

[Preparation of substrate]

A 0.3-mm thick aluminum plate (quality: 1050) was washed with a solvent so that it was degreased. The aluminum plate thus degreased was grained by a nylon brush with a 400-mesh aqueous suspension of pumice powder, and then thoroughly washed with water. The aluminum plate thus grained was dipped in a 45° C. 25% aqueous solution of sodium hydroxide for 9 seconds so that it was etched, washed with water, dipped in a 20% nitric acid for 20 seconds, and then washed with water. The etched amount of the grained aluminum surface was about 3 g/m². The aluminum plate thus treated was then anodically oxidized by direct current anodizing at a current density of 15 A/dm² with a 7% sulfuric acid as an electrolyte to form an oxide layer having a thickness of 3 g/m² thereon, washed with water, and then dried. The aluminum plate thus treated was coated with the following undercoating solution, and then dried at a temperature of 80° C. for 30 seconds. The dry coated amount was 10 mg/m².

| Undercoating solution | |
|---|---|
| β-Alanine | 0.1 g |
| Phenylphosphonic acid | 0.05 g |
| Methanol | 40 g |
| Pure water | 60 g |

[Preparation of carbon black dispersion]

A composition comprising components having the following weight ratio was subjected to dispersion with glass beads for 10 minutes to obtain a carbon black dispersion.

| Carbon black (grain diameter: 0.2–0.3 μm) | 1 part by weight |
|---|---|
| Copolymer of benzyl methacrylate and methacrylic acid (molar ratio: 72:29; weight - average molecular weight: 70,000) | 1.6 parts by weight |
| Cyclohexane | 1.6 parts by weight |
| Methoxypropyl acetate | 3.8 parts by weight |

[Preparation of negative-working lithographic printing plate]

The aluminum plate thus obtained was coated with a photosensitive solution having the following composition, and then dried at a temperature of 100° C. for 2 minutes to obtain a negative-working photosensitive lithographic printing plate (Table 1). The dry weight was 2.0 g/m².

| Photosensitive solution | |
|---|---|
| Carbon black dispersion mentioned above | 2.4 g |
| High-molecular compound set forth in Table 1 | |
| Megafac F-176 (fluorine surface active agent, available from Dainippon Ink & Chemicals, Inc.) | 0.06 g |
| Methyl ethyl ketone | 15 g |
| 2-Methoxy-1-propanol | 12 g |

The high-molecular compounds used in Comparative Examples 1 to 4 were the following compounds and those set forth in Table 1.

(Comparative Example 1)

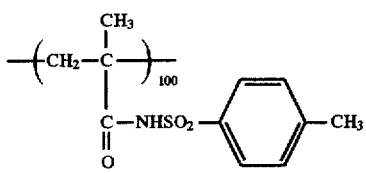

(Comparative Example 2)

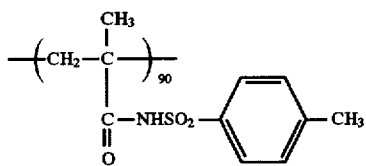

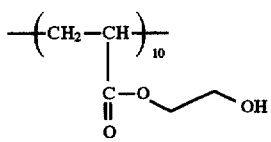

(Comparative Example 3)

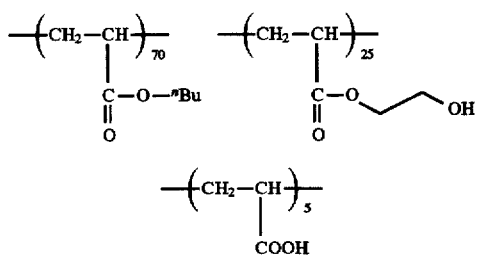

The negative-working photosensitive lithographic printing plate thus obtained was exposed to light a YAG laser which had been adjusted such that the output at the printing surface was 700 mW. The negative-working photosensitive lithographic printing plate thus exposed was then processed through an automatic developing machine loaded with DP-4 (1:8) (developer available from Fuji Photo Film Co., Ltd.) and a rinsing solution FR-3 (1:7) to obtain a negative image. The developer used was an aqueous alkali (about pH 13). The lithographic printing plate thus obtained was then mounted on a Hidel SOR-KZ Printing Machine for printing test. The results are set forth in Table 1.

TABLE 1

| Lithographic printing plate | High-molecular compound | Amount used (g) | Number of printed sheets |
|---|---|---|---|
| Example 1 | High-molecular compound of Synthesis Example 7 | 2.21 | 20,000 |
| Example 2 | High-molecular compound of Synthesis Example 8 | 2.18 | 30,000 |
| Example 3 | High-molecular compound of Synthesis Example 9 | 2.15 | 30,000 |
| Example 4 | High-molecular compound of Synthesis Example 10 | 2.20 | 35,000 |
| Example 5 | High-molecular compound of Synthesis Example 11 | 2.14 | 25,000 |
| Example 6 | High-molecular compound of Synthesis Example 12 | 2.20 | 20,000 |
| Example 7 | High-molecular compound of Synthesis Example 13 | 2.18 | 35,000 |
| Example 8 | High-molecular compound of Synthesis Example 14 | 2.17 | 35,000 |
| Example 9 | High-molecular compound of Synthesis Example 15 | 2.16 | 25,000 |
| Example 10 | High-molecular compound of Synthesis Example 16 | 2.18 | 40,000 |
| Example 11 | High-molecular compound of Synthesis Example 17 | 2.17 | 35,000 |
| Example 12 | High-molecular compound of Synthesis Example 18 | 2.16 | 35,000 |
| Example 13 | High-molecular compound of Synthesis Example 13; and | 1.15 | 30,000 |
|  | High-molecular compound of Synthesis Example 8 | 1.05 |  |
| Example 14 | High-molecular compound of Synthesis Example 8; and | 1.75 |  |
|  | High-molecular compound of Comparative Synthesis Example 3 | 0.40 | 20,000 |
| Comparative Example 1 | High-molecular compound shown above | 2.20 | No images formed |
| Comparative Example 2 | High-molecular compound shown above | 2.20 | <5,000 |
| Comparative Example 3 | High-molecular compound shown above | 2.20 | <5,000 |
| Comparative Example 4 | High-molecular compound of Comparative Example 3; and | 1.60 |  |
|  | Reaction product of hexamethylene diisocyanate and 2-methylimidazole (Compound described in Synthesis Example 1 of JP-A-62-164049) | 0.60 | 15,000 |

Examples 1 to 14, which employed high-molecular compounds of the present invention, all provided good printed matters. On the contrary, in Comparative Example 1, the photosensitive layer was entirely dissolved in the developer. Thus, no images were obtained. In Comparative Examples 2 and 3, a matter which slightly looked like an image was shown. However, no images withstanding printing were obtained. In Comparative Example 4, an image was obtained after a fashion. However, the printing plate showed stain on the background and provided a small number of printed sheets.

COMPARATIVE EXAMPLE 5

The procedure of Example 1 was followed except that the photosensitive solution composition was free of carbon black dispersion. The resulting negative-working photosensitive lithographic printing plate was then subjected to exposure and development in the same manner as in Example 1. As a result, the photosensitive layer was entirely dissolved in the developer, making it impossible to provide an image.

The negative-working image recording material according to the present invention can provide a lithographic printing plate which can be exposed to infrared laser to undergo heat mode writing and exhibits a high sensitivity and developability when developed with an aqueous developer (aqueous developer or aqueous alkaline developer).

While the invention has been described in detail and with reference to specific embodiments thereof, it will be apparent to one skilled in the art that various changes and modifications can be made therein without departing from the spirit and scope thereof.

What is claimed is:

1. A negative-working image recording material, comprising a high-molecular compound having a weight-average molecular weight of from 5,000 to 400,000 and a repeating unit represented by the following general formula (I), and a substance which absorbs light to generate heat:

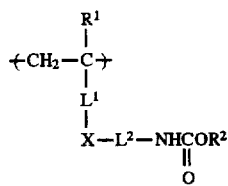

wherein $R^1$ represents a hydrogen atom, a halogen atom, a cyano group (—CN) or an alkyl group; $R^2$ represents an alkyl group, an aralkyl group or an aromatic ring group selected from the group consisting of phenyl and methoxyphenyl; $L^1$ represents a single bond or a phenylene group; $L^2$ represents an alkylene group, an alkenylene group or an aromatic ring group; X represents a single bond, —O—, —OCO—, —COO—, —CONR$^3$—, —CONR$^3$CO—, —CONR$^3$SO$_2$—, —NR$^3$—, —NR$^3$CO—, —NR$^3$SO$_2$—, —SO$_3$—, —SO$_2$NR$^3$— or —SO$_2$NR$^3$CO—; and $R^3$ represents a hydrogen atom, an alkyl group, an aralkyl group or an aromatic ring group.

2. The negative-working image recording material according to claim 1, wherein said high-molecular compound is a water-insoluble and aqueous alkali-soluble or swelling resin.

3. The negative-working image recording material according to claim 2, wherein X in the general formula (I) is —COO— or —CONR$^3$SO$_2$— and L$^1$ is a single bond.

4. The negative-working image recording material according to claim 3, wherein X in the general formula (I) is —CONHSO$_2$—.

5. The negative-working image recording material according to claim 1, wherein X in the general formula (I) is —COO— or —CONR$^3$SO$_2$— and L$^1$ is a single bond.

6. The negative-working image recording material according to claim 5, wherein X in the general formula (I) is —CONHSO$_2$—.

7. A negative-working image substance which absorbs light to generate heat and a high-molecular compound having a weight-average molecular weight of from 5,000 to 400,000 and being synthesized from a monomer represented by the following general formula (II):

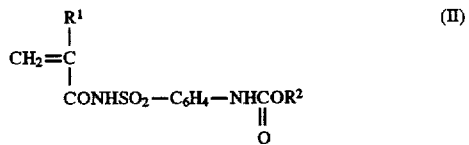

wherein $R^1$ represents a hydrogen atom, a halogen atom, a cyano group (—CN) or an alkyl group; and $R^2$ represents an alkyl group, an aralkyl group or an aromatic ring group.

8. A negative-working image substance which absorbs light to generate heat and a water-insoluble and aqueous alkali-soluble or swellable high-molecular compound having a weight-average molecular weight of from 5,000 to 400,000 and being synthesized from a monomer represented by the following general formula (II):

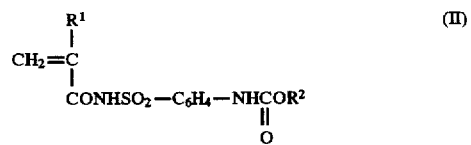

wherein $R^1$ represents a hydrogen atom, a halogen atom, a cyano group (—CN) or an alkyl group; and $R^2$ represents an alkyl group, an aralkyl group or an aromatic ring group.

* * * * *